United States Patent
Purushothaman et al.

(10) Patent No.: US 10,734,978 B2
(45) Date of Patent: Aug. 4, 2020

(54) ENHANCED IMMUNITY LATCHED LOGIC STATE RETENTION

(71) Applicant: Texas Instruments Incorporated, Dallas, TX (US)

(72) Inventors: Soman Purushothaman, Tharuvana (IN); Sankar Prasad Debnath, Bangalore (IN); Per Torstein Roine, Oslo (NO); Steven C. Bartling, Dallas, TX (US); Keshav Bhaktavatson Chintamani, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/236,330

(22) Filed: Dec. 28, 2018

(65) Prior Publication Data
US 2020/0212896 A1    Jul. 2, 2020

(51) Int. Cl.
*H03K 3/037* (2006.01)
*H03K 3/012* (2006.01)

(52) U.S. Cl.
CPC .......... *H03K 3/0372* (2013.01); *H03K 3/012* (2013.01)

(58) Field of Classification Search
CPC ...... H03K 3/0372; H03K 3/012; H03K 3/037; H03K 3/0375
See application file for complete search history.

(56) References Cited

U.S. PATENT DOCUMENTS 8,824,215 B2 *  9/2014  Frederick, Jr. ......... G11C 7/065
                                                    365/189.05

* cited by examiner

*Primary Examiner* — Jung Kim
(74) *Attorney, Agent, or Firm* — Brian D. Graham; Charles A. Brill; Frank D. Cimino (57) ABSTRACT

In described examples, a latch includes circuitry for latching input information. The circuitry can be precharged in response to an indication of a first mode and can latch the input information to an indication of a second mode. The latch can optionally further latch the input information in response to a node for storing the latched input information.

10 Claims, 3 Drawing Sheets

ENHANCED IMMUNITY LATCHED LOGIC STATE RETENTION

BACKGROUND

Electronic circuits are designed to include increasingly smaller design features to attain increased functionality and reduced power consumption. Such electronic circuits can be implemented as SoC (system-on-chip) designs that are implemented using VLSI (very large scale integration) technology. Power management features for controlling power consumption can be included in such VLSI circuits. For example, the power management features can monitor and control parameters such as the rate and amounts of power consumption, operating temperatures, component lifetimes, and battery longevity of devices incorporating the VLSI circuits. However, lowering power consumption rates can result in data loss in such devices.

SUMMARY

In described examples, a latch includes circuitry for latching input information. The circuitry can be precharged in response to an indication of a first mode and can latch the input information to an indication of a second mode. The latch can optionally further latch the input information in response to a node for storing the latched input information.

DETAILED DESCRIPTION

Various highly integrated systems (such as SoCs—system on chips) can be powered from dynamically selectable power domains, for example, to reduce power consumption. The highly integrated systems can include power management control units, which can selectively control the application of power to circuits powered by independent or overlapping power domains. The circuits within at least one particular power domain can be activated (or deactivated) in response to a selection of one of various power modes, such as a "sleep" mode in which performance is curtailed by selectively removing power from some (or all) of a system (which saves power), or an "active" mode (which can provide power for increased processing speed and/or functionality).

At times, circuitry for maintaining logic states is powered-down to avoid continued consumption of power. Because powering-down the circuitry can result in a loss of data that is stored by active circuitry, various steps can be taken to preserve the data before powering-down circuitry that includes logic states. In one example, the data stored in latches (e.g., "flip-flops") can be preserved by writing the stored data (e.g., which is stored as quantized voltage levels in nodes of active circuitry) into non-volatile memory. However, including local or networked non-volatile memory into a system can increase costs, increase power consumption, and slow system operation.

Figure 1:
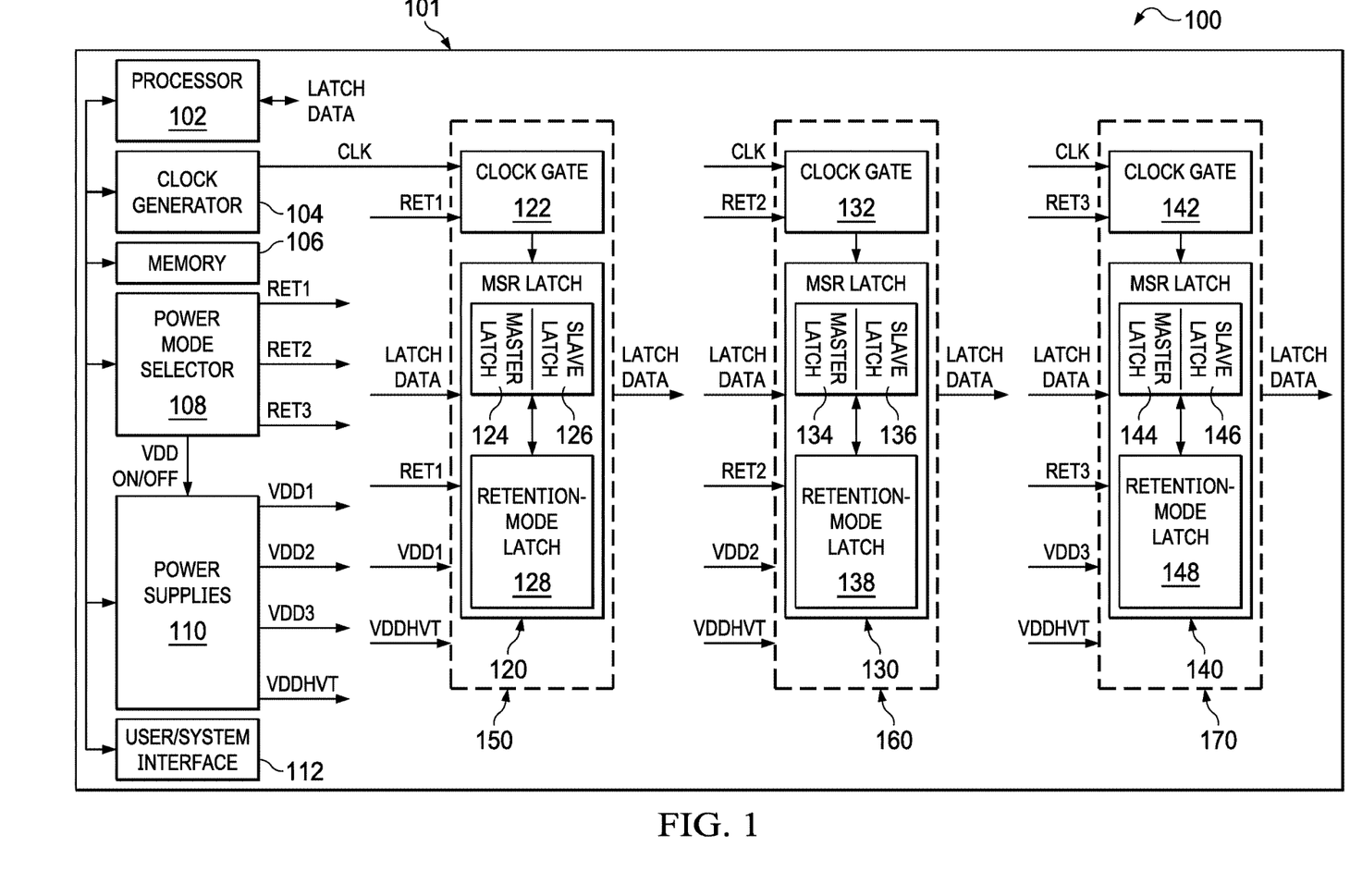
FIG. 1 is a block diagram of an example system including example master-slave-retention (MSR) latches.

FIG. 1 is a block diagram of an example system 100 including example master-slave-retention (MSR) latches. The example system 100 includes a substrate 101 for including a processor 102, a clock generator 104, a memory 106, power mode selector 108, power supplies 110, a user/system interface 112, and MSR latch circuitry 150, 160, and 170.

In at least one implementation, the processor 102 is arranged to execute instructions (e.g., software stored in memory 106), which, when executed by the processor 102, transform the processor 102 into a special purpose machine configured to perform at least one specific function or task. The processor 102 can be microprocessor, a microcontroller, a digital signal processor (DSP), and the like. The processor 102 can also be any programmable digital module or ad hoc circuit for processing signals or data. The processor 102 is arranged to read and write selected latch data (including scan-chain data) to and from the MSR latch circuitry 150, 160, and 170.

In at least one implementation, the clock generator 104 is arranged to generate (e.g., synthesize, synchronize, phase lock, multiply, divide, shape or regenerate) one or more clock signals (clocks). The clock signals can be periodic waveforms, which cycle (oscillate) at the same or different frequencies over time. The clock signals can be arranged as a clock distribution network and/or clock tree for clocking (and optionally synchronizing) components of the processor 102 and other components of the system 100. For example, the clock generator 104 is arranged to generate the clock signal CLK for clocking latch data through a scan chain including each of the MSR latch circuitry 120, 130, and 140 (as described hereinbelow with respect to FIG. 2).

In at least one implementation, the memory 106 can be volatile (e.g., losing stored information when powered-down) and/or non-volatile (e.g., retaining information when powered-down). Volatile memory can include static memory (SRAM, which can be active feedback circuitry-based) and/or dynamic RAM memory (DRAM, which can be capacitor-based). Non-volatile memory can include read-only memory (ROM), programmable read-only memory (PROM), erasable programmable read-only memory (EPROM), flash memory, hard disks, solid-state disks, CD-ROMs (e.g., including reprogrammable CD-ROMs), DVD-ROMs, "cloud" storage, memory "sticks" and/or any suitable device used for retaining information. The memory 106 can store information (e.g., code and operational data) accessed in the context of an execution environment in which one or more computer programs can implement (and/or be used by) the technology described herein. The memory 106 can be a tangible medium.

In at least one implementation, the power mode selector 108 can be arranged to selectively apply power to various components within system 100. The selective application of power can be determined in response to changes in operating conditions, such that various operating parameters (e.g., speed, data-retention, power consumption, "boot" times, and temperature) can be optimized or adapted to efficiently operate the system 100. Generally, selected components of the system 100 can be powered up (or down) when the function supplied by a selected component is needed (or no longer needed). In operation, the power mode selector 108 is arranged to selectively assert and de-assert retention-mode signals RET1, RET2, and RET3 for controlling operation of the MSR latch circuitry 150, 160, and 170, respectively. The power mode selector 108 can also control activation/deactivation of various power supplies (e.g., via the VDD on/off signal). The powering-up and powering-down of various supply voltages of the power supplies 110 can supply power on an as-needed basis to conserve power.

In at least one implementation, the power supplies 110 component is arranged to generate power for powering the MSR latch circuitry 150, 160, and 170. For example: the power supplies 110 is arranged to generate power at a first voltage output VDD1 for powering the MSR latch circuitry 150; the power supplies 110 is arranged to generate power at a second voltage output VDD2 for powering the MSR latch circuitry 160; and the power supplies 110 is arranged to generate power at a third voltage output VDD3 for powering the MSR latch circuitry 170, wherein each of the first, second, and third voltage outputs can be the same voltage as (e.g., a nominally equivalent mutual voltage as) the voltage another of the voltage outputs.

The power supplies 110 component is arranged to generate power at a voltage output VDDHVT for powering retention circuits of the MSR latch circuitry 150, where the voltage output VDDHVT is optionally a higher voltage than at least one of the voltage outputs VDD1, VDD2, and VDD3. As described hereinbelow with respect to FIG. 2, the voltage output VDDHVT can include an example voltage sufficiently high to drive a control terminal (e.g., gate) of a higher voltage threshold (HVT) transistors (which generate lower leakage currents than lower voltage threshold-LVT-transistors).

For example, the voltage output VDDHVT can be used to drive the active circuitry (e.g., for retaining logic states, as described hereinbelow with respect to FIG. 2, for example) of the retention-mode latch 128 of MSR latch 120, the retention-mode latch 138 of MSR latch 130, and retention-mode latch 148 of MSR latch 140. Also for example: the voltage output VDD1 can be used to power active circuitry of the clock gate 122, the master latch 124 and the slave latch 126; the voltage output VDD2 can be used to power active circuitry of the clock gate 132, the master latch 134 and the slave latch 136; and the voltage output VDD3 can be used to power active circuitry of the clock gate 142, the master latch 144 and the slave latch 146.

When the voltage output VDDHVT is a higher voltage than the voltage output VDD1 (e.g., for powering the MSR latch circuitry 150), the transistors of the active feedback circuitry of the retention-mode latch 128 can be (e.g., manufactured as) higher voltage threshold transistors, which have higher voltage thresholds than lower voltage threshold transistors of the master latch 124 and slave latch 126 of the same MSR latch 120. When the voltage output VDDHVT is a higher voltage than the voltage output VDD2 (e.g., for powering the MSR latch circuitry 160), the transistors of the active feedback circuitry of the retention-mode latch 138 can be higher voltage threshold transistors than the transistors of the master latch 134 and slave latch 136. When the voltage output VDDHVT is a higher voltage than the voltage output VDD3 (e.g., for powering the MSR latch circuitry 170) the transistors of the active feedback circuitry of the retention-mode latch 148 can be higher voltage threshold transistors than the transistors of the master latch 144 and slave latch 166.

When instantiations of the MSR latch circuitry include like respective components and when each of such instantiations are controlled by a common mode signal (e.g., retention-mode signal), the voltages VDD1, VDD2, and VDD3 can be the same voltage (and can be generated by a same power supply of power supplies 110).

Power can be saved by latching an existing electronic state of a slave latch into a retention mode latch in which the retention-mode latch includes higher voltage threshold transistors (e.g., than the lower voltage threshold transistors of the slave latch). The higher threshold voltage transistors of the active feedback circuitry of the retention-mode latch have lower leakage currents than the leakage currents entailed by the lower voltage threshold transistors of the slave latch (and master latch), which, in contrast, can switch at higher speeds than the higher voltage transistors.

As described herein below with respect to FIG. 2, a retention-mode latch can be operated in a retention mode to retain latched data (e.g., for leaking relatively less power), while the master latch and the slave latch can be operated in an active mode to retain latched data (e.g., for operating robustly at higher speeds).

Further, the clock gate (e.g., clock gate 122) can be arranged to gate the input a clock signal CLK in response to an indication of the retention mode (e.g., signal RET1). Gating the clock signal CLK saves power, for example, by limiting the switching of transistors that switch states in response to the gated clock. Additionally, the power supplies 110 can switch off the VDD1 power domain to conserve power during the retention mode.

In at least one implementation, the system 100 can be controlled in response to a user and/or in response to measured system parameters received via the user/system interface 112. The user/system interface 112 can include hardware sensors and indicators for outputting information to users and indicators, and for receiving information from the user and various sensors during the execution of a software application of the system 100.

Further, the user/system interface 112 can include an input/output port for networking (e.g., providing information to and/or receiving information from) networked devices. The networked devices can include any device (including scan-chain test devices) capable of point-to-point and/or networked communications with the system 100. The networked devices can include tangible, non-transitory media (such as flash memory) and/or cabled or wireless media. These and other input and output devices can be selectively coupled to the system 100 by external devices via wireless or cabled connections.

In at least one implementation, MSR latches 120, 130, and 140 can be used to preserve data in a retention mode while consuming a relatively low amount of power. Some low-power retention latches include low-leakage retention latches (e.g., 128, 138, and 148) including ultra-low leakage (ULL) transistors. The ULL transistors are arranged to couple logic signals for writing information to (or otherwise controlling) the low-leakage retention latches. The gate structures of such ULL transistors are manufactured to operate using high(er) voltage thresholds (HVT). In comparison with standard voltage threshold (SVT) transistors, the HVT transistors (of a given process for manufacturing transistors of a given low-leakage retention latch) have higher dynamic (e.g., during switching) power consumption, lower leakage currents, and higher operating latencies.

The inclusion of the HVT transistors in low-leakage retention latches can increase the switching latency of the low-leakage retention latches, for example, because of the higher voltage thresholds and inductances of the gates of the HVT transistors. The increased latency can slow the performance of a device that includes HVT-transistor low-leakage retention latches when HVT transistors are arranged in a timing critical path of the device.

Additionally, the HVT transistors of a low-leakage retention latch are operated at a power rail voltage (e.g., VDDHVT) sufficiently high for driving the HVT transistors. A voltage sufficient for driving the control terminals (e.g., gates) of HVT transistors can be substantially higher than voltages sufficient for driving standard voltage threshold (SVT) transistors. For example, a substantially higher gate voltage is a voltage sufficient to reliably switch an SVT transistor, but not switch an HVT transistor. The higher power rail voltages can also result in higher dynamic power consumption when the HVT transistors are switched.

As described below with reference to FIG. 2, a preset signal (e.g., PREZ) can be asserted asynchronously. The assertion of the PREZ signal can set the state of the master latch 230 and the slave latch 240 to a known state (e.g., for operational or testing purposes).

Figure 2:
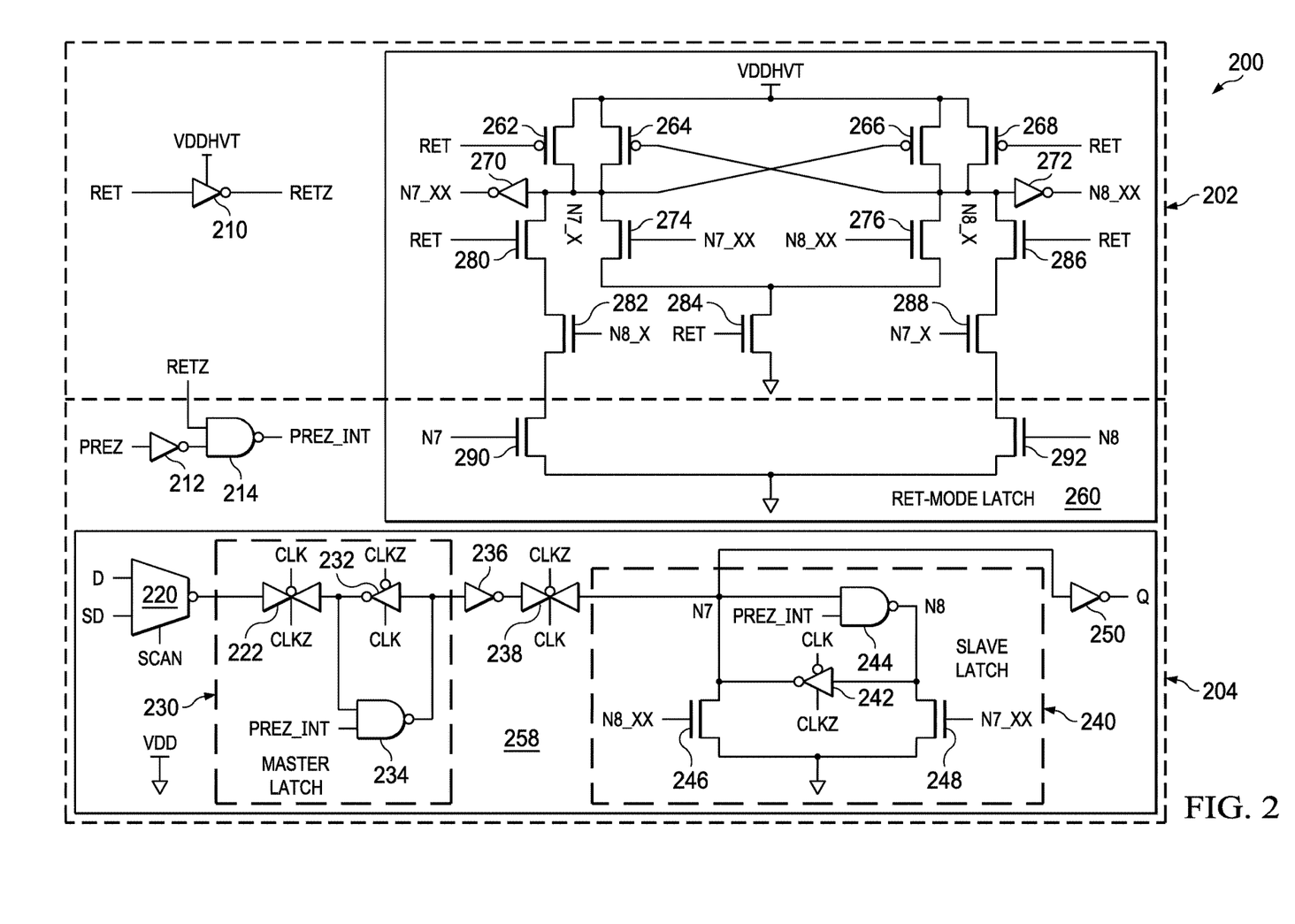
FIG. 2 is a schematic diagram of an example MSR latch.

FIG. 2 is a schematic diagram of an example MSR latch 200. The example MSR latch 200 can be a latch such as MSR latch circuitry 120, 130, and 140. The example MSR latch 200 includes a first latch 258 and a second latch 260. The first latch 258 includes a master/slave latch pair (e.g., master latch 230 and slave latch 240), which are activated during an active operating mode (active mode), and can be at least partially deactivated during a retention operating mode (retention mode).

During the active mode, the second latch 260 (e.g., retention-mode latch 260) can be at least partially deactivated during the active mode. For example, the retention-mode (ret-mode) latch 260 can be deactivated by performing a precharging or clearing operation in which a same logic state is set or cleared in complementary feedback nodes of the ret-mode latch 260.

During the retention mode, the ret-mode latch 260 can be activated to input, latch, and retain an existing logic state latched by the first latch (e.g., latched by the slave latch 240) during (or around the activation of) the retention mode. The ret-mode latch 260 is arranged to conserve power, for example, by not providing a static current path and reducing leakage while operating during the retention mode.

The power domain 204 is selectively coupled for applying power to transistors (e.g., including transistors for implementing the illustrated logic gates) of the first latch 258. The power domain 204 of a first MSR latch 200 can be selectively powered by a power signal such as VDD1, described hereinabove with respect to FIG. 1 (a second MSR latch can be selectively powered by VDD2, and a third MSR latch can be selectively powered by VDD3). The power domain 204 can be selectively powered in response to an operating mode. For example, a first voltage (e.g., VDD1 coupled to MSR latch 200) can be coupled to the power domain 204 during an active operating mode (active mode) and can be at least partially decoupled from the power domain 204 during a retention operating mode (retention mode). The first voltage (e.g., VDD1 coupled to the power domain 204) can be a voltage selected to efficiently drive lower voltage threshold transistors included in the power domain 204 (e.g., as compared against driving higher voltage threshold transistors included in the power domain 202). Further, the transistors 290 and 292 are arranged to level-shift control signals from the power domain 204 to the power domain 202.

The power domain 202 is coupled for powering transistors (e.g., including transistors arranged within the illustrated logic gates) of a second latch of the MSR latch 200. The second latch can be a retention-mode latch (e.g., ret-mode latch 260). The ret-mode latch 260 includes active feedback circuitry including the cross-coupled PMOS transistors 264 and 266. The active feedback circuitry can be powered by a second voltage (e.g., VDDHVT coupled to the power domain 202) can be selected for driving higher voltage threshold transistors included in the power domain 202. The second voltage can be selected for driving higher voltage threshold transistors included in the power domain 202. Coupling higher voltages to higher voltage threshold transistors helps ensure lower leakage currents (while helping to ensure proper switching) of the higher voltage threshold transistor.

Other transistors of the second latch can be included within the power domain 202. For example, the rail transistors 290 and 292 are included in the power domain 204 and are arranged to level-shift indications (e.g., signals N7 and N8) for programming active portions of the ret-mode latch 260 across differing power domains (e.g., which can operate a different voltage levels). The inverter 210 is included by the power domain 202 as well, and is arranged for generating the inverse retention mode (RETZ) signal.

In the example MSR latch 200, all SVT (standard voltage threshold) transistors can be powered by a first power rail 204 (e.g., VDD), while the HVT (e.g., higher voltage threshold) transistors of the retention-mode latch are powered by a second power rail 202 (e.g., VDDHVT, which can be the same voltage as—or a higher voltage than—the first power rail). The first power rail 204 can supply a lower voltage than the voltages suitable for driving HVT transistors, which reduces the dynamic power otherwise consumed by SVT transistors being operated at voltages suitable for driving HVT transistors. Additionally, low latencies of signal propagation can be obtained even at lower first-rail voltages when SVT or LVT (e.g., lower voltage threshold) transistors are arranged in a critical timing path in the master/slave latch pair.

The master latch 230 and the slave latch 240 (of the example retention latch 200) can include transistors having lower gate threshold voltages (which are suitable for generating reduced latencies than those otherwise incurred for each such transistor), while the retention-mode latch (ret-mode latch) 260 can include transistors having higher threshold voltages (which are suitable for maintaining low-leakage currents in each such transistor). The example ret-mode latch can be used to save power by retaining the latched logic state from the active feedback circuitry of the slave latch 240 during the retention mode (e.g., during which power can be removed from the first power domain 204).

The master/slave latch pair (e.g., 230 and 240) includes lower voltage threshold transistors arranged in a critical timing path of the example MSR latch 200, which reduces the latency of the MSR latch 200 while operating in the active mode. The active circuitry of the master/slave latch pair includes a master latch 230 and a slave latch 240, where each such latch can be formed using lower voltage threshold transistors. In contrast, the active circuitry of the ret-mode latch 260 includes higher voltage threshold transistors (e.g., which decreases leakage during the retention mode, during which the degree of latency—e.g., the need for speed—of the master/slave late pair is reduced, if not mooted).

In operation in the active mode, the master latch 230 is arranged to latch a logic state in response to external data (e.g., latch data) selected via the multiplexor 220. The latch data can be operational data (such as data generated in normal operation that is coupled to the D input of the multiplexor 220) or scan data (such as data from other latches in a scan chain, where the latched data from a previous latch in the scan chain is coupled to the SD input of the multiplexor 220). The multiplexor 220 couples a selected one of the D and the SD input to the multiplexor 220 output in response to the state of the scan signal.

The master latch 230 includes a transmission gate 222 arranged to pass the logic value received from the multiplexor 220 to a logic state input node of active feedback circuitry of the master latch 230 during a period of time in which the clock signal CLK is low (as described below with respect to FIG. 3). The buffer 232 inhibits the feedback path of the master latch 230 during the period of time in which the clock signal CLK is low, such that output portion of the feedback loop does not contend with the output of the transmission gate 222, and such that the logic value passed by the transmission gate 222 sets the logic state of active feedback circuitry (which includes NAND gate 234).

The NAND gate 234 includes a first input coupled to the output of the transmission gate 222 (e.g., the logic state input gate) and the output of the tristate inverting buffer 232 (e.g., which is a logic state feedback gate for latching input data). The NAND gate 234 further includes a second input coupled to the PREZ_INT signal. The PREZ_INT signal is generated by NAND gate 214 and inverter 212 in response to the PREZ and the RETZ signals, such that a preset operation is initiated in response to the assertion of a preset signal when the retention mode signal has not been asserted. When the PREZ_INT signal is high, the NAND gate 234 output signal inverts the logic state of the logic state input node (which is the output of the transmission gate 222).

When the clock signal CLK transitions high, the channel through the transmission gate 222 is closed, and (while the PREZ_INT remains high) the tristate buffer inverting buffer 232 is arranged to invert the output signal of the NAND gate 234: the double inversion of the login input state node helps ensure the logic input state node is actively driven (when the clock signal CLK is high) with the same logic state previously input by the transmission gate 222 (which establishes an actively latched feedback state of the master latch 230). The NAND gate 234 output signal is also inverted by the inverter 236 and passed through the transmission gate 238 (when the clock signal CLK is high).

When the PREZ_INT signal is low, the active feedback loop established between the NAND gate 234 and the inverting tristate buffer 232 is disconnected. Disconnecting the active feedback loop helps ensure the latched state of the master latch 234 does not toggle (e.g., which can conserve power) in response to changes in the input logic state selected by the multiplexor 220.

The output of the activated transmission gate 238 (e.g., which outputs the logic state of the master latch 230) is arranged to drive the logic input node N7 of the slave latch 240 when the clock signal CLK is high. The node N7 is coupled to the output Q of the first latch 258 via the inverter 250. The critical path (which traverses the inverting multiplexor 220, the NAND gate 234, the inverter 236 and the inverter 250) through the master/slave latch pair includes an even number of inversions, such that the output of the master/slave latch pair (230 and 240) is a non-inverting Q output (e.g., with respect to the associated D and SD inputs).

When the clock signal CLK is high, the feedback inverting tristate buffer 242 is tristated, such that the output of the buffer 242 does not contend with the output of the transmission gate 238. The gate voltage N8_XX (coupled to the gate of the rail transistors 246) is low during the active mode and, when low, does not contend with the output of the transmission gate 238. In a similar manner, the gate voltage N7_XX, when low, does not contend with the output N8 of the NAND gate 244.

When the clock signal CLK transitions low (and PREZ_INT remains high), the channel through the transmission gate 238 is closed, and the tristate buffer inverting buffer 242 is arranged to invert the output signal N8 of the NAND gate 244. The double inversion of the login input state node N7 ensures the logic input state node N7 of the slave latch 240 is actively driven (when the clock signal CLK is low) with the same logic state previously input by the transmission gate 238 (which establishes an actively latched feedback state of the slave latch 240). The NAND gate 244 output signal N8 is also inverted by the inverter 250 for output as the first latch 258 (e.g., master/slave latch pair) output Q.

In the example, the active mode is asserted when the retention mode signal (inverted)—RETZ—is not asserted. During the active mode, the ret-mode latch 260 is precharged and maintained in a pre-charged state. Being in a precharged state facilitates lower input signal hold times for latching the ret-mode latch. The precharged state helps ensure the ret-mode latch 260 can quickly establish a latched logic state in response to a presently input logic state (e.g., via N7 and N8) of the slave latch 240. Maintaining the precharged state during operation in the active mode saves power otherwise consumed (for example) because transistors of the ret-mode latch 260 do not toggle states as a function (e.g., a direct function) of a clock signal (in the active mode).

To precharge the ret-mode latch in the active mode, the retention mode signal RET remains low. When the retention mode signal is low (e.g., not asserted), the NMOS transistors 280, 284, and 286 are all off, while the PMOS precharge transistors 262 and 268 are on. When the transistors 262 and 268 are on, a channel through each of transistors 262 and 268 is established such that each of the respective nodes N7_X and N8_X is precharged (e.g., to a logic high state during the active mode). The node N8_X (including the drain of transistor 266) is coupled to the gate of a first cross-coupled PMOS transistor 264 (such that the PMOS transistor 264 is off during the active mode), whereas the node N7_X is coupled to the gate of a second, associated cross-coupled PMOS transistor 266 (such that the PMOS transistor 266 is also off during the active mode).

As described below with reference to FIG. 3, the retention mode signal RET (320) is asserted when the clock signal CLK (310) is low. With reference again to FIG. 2, PMOS precharge transistors 262 and 268 are turned off in response to the assertion of the retention mode signal, while the NMOS transistors 280, 284, and 286 are turned on in response to the assertion of the retention mode signal. When the transistors 262 and 268 are turned off, the channel through each of transistors 262 and 268 is collapsed such that each of the respective nodes N7_X and N8_X is decoupled from the second power rail VDDHVT (e.g., with reference to the first power rail VDD).

Because of delays in turning on at least one of the transistors 264 and 266, both the nodes N7_X and N8_X remain at least temporarily high (as described following herein, one of the nodes N7_X and N8_X is later forced low), such that initially both of the transistors 282 and 288 remain on. The source of transistor 282 is selectably coupled to ground (e.g., a low power rail) via the NMOS rail transistor 290 (which is controlled by the node N7 of the slave latch 240), whereas the source of transistor 288 is selectably coupled to ground via the NMOS rail transistor 292 (which is controlled by the node N8 of the slave latch 240). Because node N7 and N8 of the slave latch 240 are set to complimentary states, only one (e.g., exactly one) of the rail transistors 290 and 292 are coupled to ground at a time.

In a first example in which node N7 of slave latch 240 is high (and the node N8 is low), the rail transistor 290 is turned on, such that the NMOS stack of transistors 280, 282, and 290 is arranged to selectively couple the precharged charge of node N7_X to ground via a first path. In response to the transition of the node N7_X to ground, the inverter 270 drives node N7_XX high. When node N7_XX is driven high (while node N8_XX remains low), the transistor 274 is turned on, while the transistor 276 remains off.

When the transistor 274 is turned on, the transistor 274 couples a second path from node N7_X to ground via the activated rail transistor 284 (which is activated in response to the asserted retention mode). The second path to ground from node N7_X (via transistor 284) maintains the active latching of the cross-coupled transistors 264 and 266 in the event of a spurious toggling of node N7. (Such spurious toggling of node N7—and node N8—can occur, for example, as a result of noise and/or when power is removed from the domain 204, which, in turn, effectively tristates the output nodes N7 and N8.)

The cross-coupling of the active feedback circuitry of the transistors 274 and 276 via the inverters 270 and 272 can be called "indirect coupling" and enhances the immunity of the ret-mode latch 260 circuitry to electrical effects resulting from device mismatches (e.g., coupling HVT transistors to LVT or SVT transistors) and/or parameter skew of manufacturing processes employed to form such disparate devices on a single substrate. Further, the indirect coupling can increase the immunity of the active feedback circuitry to, for example, noise or switching glitches occurring on nodes N7 and/or N8.

When node N7_X is pulled low (as described above in response to node N7 being high when the retention mode is asserted), the PMOS transistor 266 is turned on, which maintains the node N8_X at a high level (e.g., irrespective of the state of the retention mode signal). The retention of the node N8_X at the high level helps ensure the inverter 272 continues to output a logic zero (low) state (on node N8_XX). In response to the low state of node N8_XX, the transistor 276 remains off, such that the transistor 276 does not actively transfer charge to ground (e.g., which masks "glitches" input via node N8, which controls the rail transistor 292). The high state of the node N8_X helps ensure the cross-coupled transistor 264 remains off. When the cross-coupled transistor 264 is off (and the cross-coupled transistor 266 is on), the active circuitry including the cross-coupled transistors 264 and 266 electronically latch the logic state asserted by the input nodes N7 and N8.

Coupling charge from VDDHVT via the PMOS transistor 266 to the node N8_X helps maintain the off-state of the complementary cross-coupled transistor 264 (despite drain and gate leakage of activated transistors coupled to the node N8_X). Maintaining the off-state of the complementary transistor 264 (while maintaining the on-state of the transistor 266 itself) actively and selectively retains the latched state (e.g., where also the node N7_XX retains the logic state of node N7 via the second path to ground coupled through transistor 284).

In a second example in which node N7 of the slave latch 240 is low (and the node N8 is high), the rail transistor 292 is turned on, such that the NMOS stack of transistors 286, 288, and 292 is arranged to selectively couple the pre-charged charge of node N8_X to ground via a first path. In response to the transition of the node N7_X to ground, the inverter 272 drives node N8_XX high. When node N8_XX is driven high (while node N7_XX remains low), the transistor 276 is turned on, while the transistor 274 remains off.

When the transistor 276 is turned on, the transistor 276 couples a second path from node N8_X to ground via the activated rail transistor 284 (which is activated in response to the asserted retention mode). The path to ground from node N8_X maintains the active latching of the cross-coupled transistors 264 and 266 in the event, for example, that power is removed from the domain 204 (which, in turn, effectively tristates the output nodes N7 and N8).

When node N8_X is pulled low, the PMOS transistor 264 is turned on, which maintains the node N7_X at a high level (e.g., irrespective of the state of the retention mode signal). The retention of the node N7_X at the high level helps ensure the inverter 270 continues to output a logic zero (low) state (on node N7_XX). In response to the low state of node N7_XX, the transistor 274 remains off, such that the transistor 274 does not actively transfer charge to ground (e.g., which masks "glitches" input via node N7, which controls the rail transistor 290). The high state of the node N7_X helps ensure the cross-coupled transistor 266 remains off. When the cross-coupled transistor 266 is off, and the cross-coupled transistor 264 is on, the active circuitry including the cross-coupled transistors 264 and 266 electronically latch the logic state asserted by the input nodes N7 and N8.

Coupling charge from VDDHVT via the PMOS transistor 264 to the node N7_X helps maintain the off-state of the complementary cross-coupled transistor 266 (despite drain and gate leakage of activated transistors coupled to the node N7_X). Maintaining the off-state of the complementary transistor 266 (while maintaining the on-state of the transistor 264 itself) actively and selectively retains the latched state (e.g., where also the node N8_XX retains the logic state of node N8).

As described below with reference to FIG. 3, the power (e.g., VDD and VDDNW 330) is removed (e.g., from the power domain 204). With reference again to FIG. 2, the removal of the power from the power domain 204 effectively tristates the outputs of the transistors driving the respective nodes N7 and N8 (which can render the rail transistors 290 and 292 more susceptible to errant switching due to noise on nodes N7 and N8). For example, the power mode selector 108 (shown in FIG. 1) can be arranged to signal the power supplies 110, such that power is not consumed (e.g., at operational rates) by the master latch 258 during the retention mode. The loss of such power can cause the first latch 258 (including the master latch 230 and the slave latch 240) to lose the information stored therein as latched states. The power mode selector 108 can be arranged to assert a retention signal (e.g., RET1, RET2, and/or RET3) for decoupling power to a power domain 204 of a selected MSR latch 200. The power mode selector 108 can be arranged to assert a retention signal in response to a determination (e.g., made by the processor 102) that at least a portion of the system 100 is to be placed in a power-saving mode.

In response to a determination (e.g., made by the processor 102) that at least a portion of the system 100 is to be activated (e.g., placed in an active mode), the power selector 108 can signal the power supplies 110 to couple power to (and/or generate power for) the power domain 204. After power is re-applied to the power domain 204, the state of slave latch 240 is set in response to the N7_XX and N8_XX nodes of the ret-mode latch 260. The N7_XX and N8_XX nodes (e.g., being complementary signals) activate one of the rail transistors 246 and 248, such the state of slave latch 240 is set in response to information previously actively stored in the slave latch 240 before assertion of the retention mode signal (and/or the removal of power from the power domain 204).

After the state of slave latch 240 is set in response to information previously actively stored in the slave latch, the retention mode signal (RET) is de-asserted and the clock signal (CLK) is transitioned high (as described hereinbelow with respect to FIG. 3).

Figure 3:
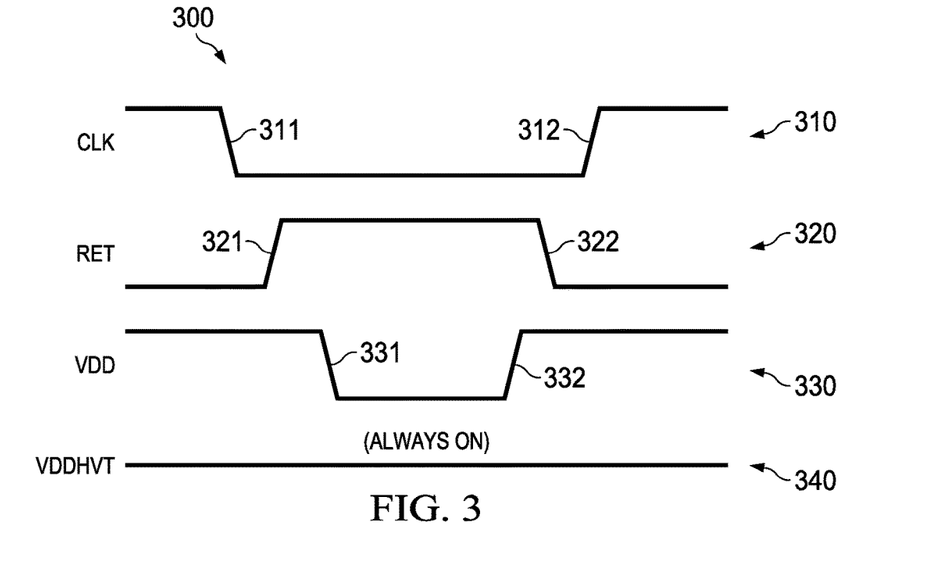
FIG. 3 is a waveform diagram of example mode transitions of the example MSR latch.

FIG. 3 is a waveform diagram of example mode transitions of an example MSR latch 200. Waveform diagram 300 includes waveforms of the signals CLK (clock) 310, RET (retention mode signal) 320, VDD (lower voltage threshold power rail) 330, and VDDHVT (higher voltage threshold power rail) 340. The latch 258 (of MSR latch 200) is activated during the active mode (e.g., when the RET signal 320 is low) and the latch 258 is least partially deactivated during a retention mode (e.g., when the RET signal 330 is high).

In the active mode, the CLK signal 310 oscillates at a clocking frequency for transferring data, for example, through at least one example MSR latch 200 (e.g., where multiple instances of an MSR latch 200 can be arranged serially as a scan chain). During the active mode, the master latch 230 is arranged to receive data input (e.g., via a D or an SD input terminal) and latch the data input when the CLK signal 310 is low. The latched data from the master latch 230 is input into the slave latch 240 when the CLK signal 310 transitions high. For example, at transition 311 (during which the CLK signal transitions low) the data received by the slave latch 240 from the master latch 230 is latched into the slave latch 240.

The active mode ends in response to the assertion of the retention mode (e.g., at transition 321 of the signal RET). The selection of which mode is to be asserted can be determined, for example, by the power mode selector 108 described above with reference to FIG. 1. When the signal RET 320 is asserted, the ret-mode latch 260 (which is precharged during the active mode in a manner similar to the precharging of a sense amplifier) couples to ground a control node of one of a pair of cross-coupled transistors (e.g., 264 and 266), such that the latched logic state of the slave latch 240 is latched by the ret-mode latch 260. When the signal RET 320 is asserted, the CLK signal 310 is gated off, which reduces power consumption and reduces electrical noise during the retention mode.

In response to the assertion of the retention mode, the power rail (e.g., VDD 330) for powering the master latch 230 and the slave latch 240 is turned off (or otherwise removed or powered down) at transition 331. Turning off the power supplied by the VDD rail 330, for example, conserves power otherwise dissipated by the circuitry of the master latch 230 and the slave latch 240. The power rail (VDDHVT 340) for powering the retention mode latch remains active (e.g., high) in both the active mode and the retention mode, such that (for example) the ret-mode latch 260 can be precharged during the active mode, and such that the ret-mode latch 260 can retain during the retention mode the data latched from the slave latch 240. The MSR latch 200 remains in the retention mode (e.g., remains in the retention mode indefinitely) until the power mode selector determines a transition to the active mode.

At transition 332 of the VDD rail 330 is reactivated in response to a determination of a transition to the active mode. Activating the VDD rail 330 activates the master latch 230 and the slave latch 240, such that the master latch 230 and the slave latch 240 can input and latch received data. Additionally, assertion of the PREZ signal (described hereinabove) can set the latched state of the master latch 230 and the slave latch 240 to known values (e.g., for testing purposes). When the PREZ signal is de-asserted, the slave latch 240 is set in response to the value latched in the ret-mode latch 260 during the retention mode.

When the RET signal 320 is de-asserted at transition 322 (e.g., in response to the determination of a transition to the active mode), the retention-mode latch is disabled (e.g., by precharging both control nodes of the cross-coupled transistors of the active feedback circuitry of ret-mode latch 260). After the transition 322, the CLK signal 310 is gated on (e.g., in response to the de-assertion of the RET signal 320), which generates the transition 312 (e.g., rising edge) of the CLK signal 310. The rising edge of the CLK signal 310 at transition 312 can be used to clock the information restored in the slave latch 240 (e.g., previously stored in the ret-mode latch 260 during the retention mode) into an input (e.g., S input, or SD input) of another instance of the MSR latch 200). Further cycles of the CLK signal 310 can be used to clock data through other scan latches of the scan chain, such that (for example) data stored during the retention mode in multiple instances of the MSR latch 200 can be read (e.g., by the processor 102) for restoring a context of an execution environment and/or testing purposes.

Accordingly, the ret-mode latch 260 can be written-to in response to a rising edge (e.g., transition 321) of the RET signal 320. As the retention-mode latch is being written-to (e.g., from the slave latch 240), the ret-mode latch 260 is enabled, such that the ret-mode latch 260 can retain the state of the written data while the ret-mode latch 260 is in the retention mode (e.g., between transitions 321 and 322). When the RET signal 320 is de-asserted, the ret-mode latch 260 exits the retention mode, and the value stored by the ret-mode latch 260 is written (e.g., written back) into the slave latch 240 (which is also transitioned into an active mode). The ret-mode latch 260 is disabled from latching (e.g., by precharging control nodes of active feedback circuitry) during the active mode, which conserves power otherwise dissipated by switching in response to the CLK signal 310 during the active mode.

Figure 4:
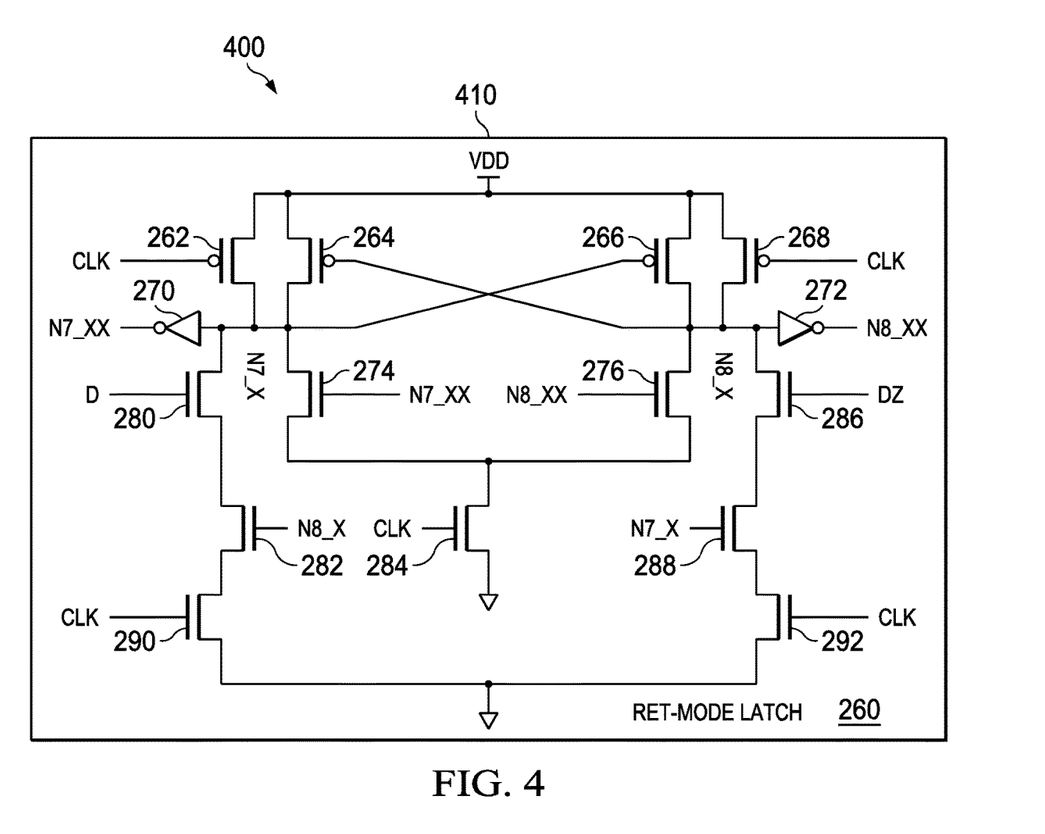
FIG. 4 is a schematic diagram of an example directly-and-indirectly coupled D-latch.

FIG. 4 is a schematic diagram of an example directly (e.g., via gates of transistors 264 and 266) and indirectly (e.g., via gates of transistors 274 and 276) coupled D-latch. The example D-latch 400 is similar in structure to the ret-mode latch D 260, although the D-latch 400 can operate differently in response to differently timed control signals, for example. The D-latch 400 can be integrated on a substrate 410, which can include multiple instances of the D-latch 400, as well other circuitry, such that a scan chain can be formed for programming and testing other circuitry included on a single substrate 410 (for example). The D-latch 400 (e.g., and modifications thereof) can be used to implement the master latch 230 and slave latch 240 (e.g., by switching polarities of the CLK signal for respective components of the latches).

In operation, the timing of the D-latch 400 is controlled by the CLK signal. The CLK signal can indicate D-latch 400 operation in one of two modes: when the CLK signal is low, a first mode is indicated for precharging the D-latch 400 (which is similar in architecture to a sense-amplifier); and when the CLK signal is high, a second mode is indicated for latching input information. For example, when the CLK signal is low, the PMOS transistors 262 and 268 are arranged to precharge the nodes N7_X and N8_X (which helps ensure the cross-coupled transistors 264 and 266 are both off). In response to a high input from node N7_X, the inverter 270 outputs a low signal at node N7_XX for turning off and/or maintaining the transistor 274 in an off state. Similarly, in response to a high input from node N8_X, the inverter 272 outputs a low signal (N8_XX), for turning off and/or maintaining the transistor 276 in an off state. Because the CLK signal is low, a first NMOS transistor "stack" (which includes the NMOS transistors 280, 282, and 290) coupled to node N7_X does not pull down node N7_X, and a second NMOS transistor "stack" (which includes the NMOS transistors 286, 288, and 292) coupled to node N8_X does not pull down node N8_X. Both the directly cross-coupled nodes N7_X and N8_X are precharged when the CLK signal is low, because (for example) the cross-coupled nodes N7_X and N8_X are respectively coupled to a high power rail (e.g., VDD) and the cross-coupled nodes N7_X and N8_X are respectively not coupled to a low power rail (e.g., ground).

When the CLK signal transitions high, the PMOS transistors 262 and 268 are turned off, while the PMOS transistors 264 and 266 are initially both off. Because the D and the DZ inputs are complementary, only one of the transistors 280 and 286 is selectively activated in response the respective input signals. The selective activation of only one of the transistors 280 and 286 causes the value of the input D to be written into and latched by the D-latch 400.

In a first example where the D input is high, the NMOS transistor 280 is on (in response to a high state of input D). Further, the NMOS transistor 290 is on (e.g., activated) in response to the CLK signal transitioning high. The NMOS transistor 282 is initially on because the cross-coupled node N8_X (in addition to node N7_X) is precharged to a high state. The node N7_X is selectively coupled to the low power rail (e.g., pulled down to ground) in response to the on-state (e.g., being activated) of each of the transistors 280, 282, and 290 in the first NMOS stack (which is a first path to ground). When the node N7_X is pulled down, the cross-coupled transistor 266 is arranged to pull up the node N8_X, which couples charge to the node N8_X to actively maintain the high state of the node N8_X. (As described hereinabove, the cross-coupled transistors 264 and 266 are latched in response to being driven by mutually controlled respective complementary actively driven gate signals.)

Further (e.g., in response to both the input D and the CLK being high), the low state of node N7_X forces the inverter 270 high, such that node N7_XX turns on the transistor 274. Because the transistor 284 (coupled in cascode with transistor 274) is turned on in response to the CLK being high, a second (e.g., delayed) path from the node N7_X to ground is selectively controlled (e.g., opened) by the latched state of the D-latch 400 (e.g., as compared to the being directly controlled by the D-input). The delayed, second path to ground helps ensure the cross-coupled active feedback circuitry (e.g., which includes the cross-coupled transistors 264 and 266) latches the correct data by masking "glitches" on the D-input, which might otherwise pull down the node N7-X and erroneously shunt precharged charge from a complementary to ground. The "glitches" can occur during a write operation (until when CLK subsequently transitions low) as a result of noise and/or in response to transistor mismatches (e.g., transistor drive strength differences). The delayed second path to ground (e.g., which is controlled by the "indirect coupling" via the inverter 270) can also help reduce hold times on the D (and DZ) input, which helps increase robustness of the circuit against noise and variations resulting from design or manufacturing tolerances.

In a second example where the DZ input is high (and the D input is low), the NMOS transistor 286 is on (in response to a high state of input DZ). Further, the NMOS transistor 292 is on (e.g., activated) in response to the CLK signal transitioning high. The NMOS transistor 288 is initially on because the cross-coupled node N7_X (and N8_X) is precharged to a high state. The node N8_X is selectively coupled to the low power rail (e.g., pulled down) along a first path in response to the on-state (e.g., being activated) of each of the transistors 286, 288, and 292 arranged as an NMOS stack. When the node N8_X is pulled down, the cross-coupled transistor 264 is arranged to pull up the node N7_X, which couples charge to the node N7_X to actively maintain the high state of the node N7_X.

Further (e.g., in response to both the input DZ and the CLK being high), the low state of node N8_X forces the inverter 272 high, such that node N8_XX turns on the transistor 276. Because the transistor 284 (coupled in cascode with transistor 276) is turned on in response to the CLK being high, a second (e.g., delayed) path from the node N8_X to ground is selectively controlled (e.g., opened) by the latched state of the D-latch 400 (e.g., as compared to the being directly controlled by the D-input). The delayed, second path to ground helps ensure the cross-coupled active feedback circuitry (e.g., which includes the cross-coupled transistors 264 and 266) latches the correct data by masking "glitches" on the D-input, which might otherwise pull down the node N8-X and shunt precharged charge from a complementary to ground.

As described above, the first and second complementary (e.g., cross-coupled) nodes (e.g., N7_X and N8_X) are arranged to be precharged (e.g., such that both nodes include a logic 1 voltage) during the active mode. In response to a control signal derived from a selected one of the first and second complementary nodes (e.g., where the selected node is pulled down), the selected one of the first and second complementary nodes is further (e.g., subsequently) coupled to ground via a second path, which includes the activated transistor 284 (which is activated in response to the assertion of the retention mode signal).

In another example, cross-coupled NAND gates (e.g., as compared against mere cross-coupled transistors) are arranged to latch a value derived in response to the logic states of N7_X and N8_X. The logic state of the cross-coupled NAND gates can be set in response to a selection of one of a D input and an SD input, where the selection can be implemented as part of the NMOS stack of the "first path to ground."

Modifications are possible in the described examples, and other examples are possible, within the scope of the claims.

What is claimed is:

1. An apparatus, comprising:
 a first latch including circuitry for latching input data in response to a retention signal that indicates whether the apparatus is in a first mode or a second mode, the circuitry including:
  a first transistor including an output coupled to a first node, wherein the first transistor is adapted to couple the first node with a first power rail during the first mode;
  a second transistor including an output coupled to a second node, wherein the second transistor is adapted to couple the second node with the first power rail during the first mode, wherein:
   the first transistor includes a gate coupled to the second node; and
   the second transistor includes a gate coupled to the first node;
  a first path that includes a first set of transistors coupled in series between the first node and a second power rail; and
  a second path that includes a second set of transistors coupled in series between the second node and the second power rail; and a second latch coupled to the first latch to provide the input data, wherein the second latch includes transistors that have a first threshold voltage that is lower than a second threshold voltage of the first transistor and the second transistor of the first latch.

2. The apparatus of claim 1, wherein a power consumption of the circuitry is higher during the first mode, and the power consumption of the circuitry is lower during the second mode.

3. The apparatus of claim 1, wherein the first set of transistors of the first path includes: a cascode arrangement of a first NMOS transistor that includes a gate coupled to a first signal of the input data; a second NMOS transistor that includes a gate coupled to the second node; and a third NMOS transistor that includes a gate coupled to receive the retention signal.

4. The apparatus of claim 1, wherein the first latch is powered by a first power domain, and the second latch is powered by a second power domain.

5. The apparatus of claim 4, wherein the second power domain is powered-down during the second mode.

6. The apparatus of claim 1, wherein the second latch is arranged to receive, in response to a transition from the second mode to the first mode, a latched logic state of the first latch.

7. The apparatus of claim 1, wherein the circuitry of the first latch includes transistors including a leakage lower than a leakage of the transistors of the second latch.

8. The apparatus of claim 1, wherein the first latch includes transistors including a switching time slower than a switching time of the transistors of the second latch.

9. The apparatus of claim 1, wherein the second latch includes a master latch arranged to latch a received logic state during a first portion of a clock cycle, and includes a slave latch arranged to latch, during a second portion of a clock cycle, the received logic states latched by the master latch.

10. The apparatus of claim 6, including a multiplexor for selecting a scan chain input as the input data.

* * * * *